United States Patent [19]

Adams et al.

[11] Patent Number: 4,583,710

[45] Date of Patent: Apr. 22, 1986

[54] ELECTROMAGNETIC VALVE FOR PULSED MOLECULAR BEAM

[75] Inventors: Thomas E. Adams; Edward R. Grant; Bennett H. Rockney; Richard J. S. Morrison, all of Ithaca, N.Y.

[73] Assignee: Cornell Research Foundation, Inc., Ithaca, N.Y.

[21] Appl. No.: 376,811

[22] Filed: May 10, 1982

[51] Int. Cl.[4] ............................................. F16K 31/02
[52] U.S. Cl. ........................... 251/129.10; 251/335.3; 137/624.15; 250/288
[58] Field of Search .................. 251/137, 335 B, 129; 137/624.15; 250/286, 288; 222/3; 239/585, 533.12, 533.15

[56] References Cited

U.S. PATENT DOCUMENTS

| | | | |
|---|---|---|---|
| 915,716 | 3/1909 | Wilkinson | 251/137 X |
| 1,711,660 | 5/1929 | Stephenson . | |
| 2,969,926 | 1/1961 | Peeps | 239/533.15 X |
| 3,106,194 | 10/1963 | Cantwell, Jr. et al. | 239/585 |
| 3,132,767 | 5/1964 | Gardner et al. | 222/3 |
| 3,383,084 | 5/1968 | Mayfield . | |
| 3,412,971 | 11/1968 | McDivitt | 251/137 |
| 3,537,653 | 11/1970 | Jones | 239/533.15 |
| 3,548,877 | 12/1970 | Aumayer | 137/625.65 |
| 3,801,788 | 4/1974 | Milne | 250/41.9 ME |
| 3,842,266 | 10/1974 | Thomas | 250/288 |
| 3,942,485 | 3/1976 | Suda et al. | 123/32 AE |
| 4,018,241 | 4/1977 | Sodal et al. | 137/14 |
| 4,091,256 | 5/1978 | Früchtemicht | 219/121 L |
| 4,142,684 | 3/1979 | Schweitzer | 239/585 |
| 4,201,913 | 5/1980 | Bursack et al. | 250/288 |
| 4,240,266 | 12/1980 | Scrine et al. | 251/282 X |
| 4,364,413 | 12/1982 | Bersin et al. | 222/3 X |

FOREIGN PATENT DOCUMENTS

| | | | |
|---|---|---|---|
| 111375 | 4/1928 | Austria | 239/533.9 |
| 2748407 | 5/1979 | Fed. Rep. of Germany | 239/533.12 |
| 1463455 | 11/1966 | France | 239/533.12 |

OTHER PUBLICATIONS

R. Gentry and C. Giese, "Pulsed Molecular-Beam Sources", *Physics Today*, Feb., 1980, pp. 19–21.
E. I. Shebenko, A. I. Maslov, V. N. Kozlov, V. B. Yuferov, "A Pulsed Gas-Dynamic Source of Neutral Atoms, Instruments and Experimental Techniques", vol. 18, No. 5, part 2, pp. 1526–1528.

*Primary Examiner*—A. Michael Chambers
*Assistant Examiner*—John C. Fox
*Attorney, Agent, or Firm*—Jones, Tullar & Cooper

[57] ABSTRACT

An electromagnetically operated valve for generating a fast, pulsed molecular beam is disclosed. Two axially aligned solenoids are mounted in a valve housing, the front end of which is closed by end plate having a central valve aperture. The solenoids are held in spaced apart relationship by a non-magnetic ring to define a gap between the faces of the two solenoid windings. A thin disc of magnetic material moves between the solenoid cores upon energization of first one and then the other of the windings. A small diameter non-magnetic tube extends from the center of the disc coaxially through one of the solenoid cores and terminates in a stainless steel tip which carries a valve head in the form of a short rod having a flat end. The tube is axially movable by the disc to move the valve head into and out of engagement with the end plate to close and open the valve aperture. The tube is surrounded by a metal bellows which serves to isolate it and the solenoids from a sample gas reservoir surrounding the valve head and formed by the end plate and the valve housing. The aperture in the end plate is a conical hole which serves both as a valve seat and as an expansion nozzle for the gas released by operation of the valve.

The two solenoid coils are driven by suitable multivibrators which produce timed pulses to drive one solenoid to open the valve and to drive the other solenoid to close the valve, with suitable switching circuitry being provided to operate the valve at a high rate of speed.

16 Claims, 9 Drawing Figures

ELECTROMAGNETIC VALVE FOR PULSED MOLECULAR BEAM

The U.S. Government has rights in this invention pursuant to Grant No. CHE-7920858, awarded by the National Sciences Foundation.

BACKGROUND OF THE INVENTION

The present invention is directed to a fast-acting electromagnetic valve, and more specifically to a low voltage, low current solenoid-driven valve for controlling molecular beams.

Supersonic molecular beams offer important advantages for the molecular spectroscopist. In addition to high sample density, supersonic expansion provides rotational and translational cooling of the sample which significantly simplifies its spectrum by reducing congestion from hot band adsorption.

However, one disadvantage of conventional, continuously flowing molecular beams is that they place a heavy load on the equipment vacuum system. In order to maintain a low background pressure in the interaction region, the apparatus for producing a continuous beam must be equipped for high gas loads and must incorporate one or more stages of differential vacuum pumping.

To overcome the problems involved in continuous beam devices, experiments using a high intensity pulsed laser crossed with a supersonic molecular beam have been reported. The low duty cycle of a pulsed laser eliminates the need for the unbroken duty cycle of the continuous molecular beam source, and under such circumstances, incorporation of a pulsed beam valve can dramatically reduce pumping requirements. Several designs for pulse valves mounted on vacuum systems with relatively modest pumping capacities are now in use in spectroscopy and scattering laboratories. However, such devices have required extremely high voltages and currents for operation, creating cooling problems. The high power levels and the need to provide sophisticated cooling systems made such devices bulky, inconvenient, and difficult to use. In addition, many prior devices created radio frequency interference problems in the sensitive measuring equipment which required additional shielding that added to the bulk of such devices.

SUMMARY OF THE INVENTION

In accordance with the present invention, a small, pulsed beam valve has been constructed which offers important advantages over existing designs. The present valve produces a 70 microsecond molecular beam pulse through the use of a lightweight, responsive valve structure that is driven by simple, low voltage, low current driving circuits. The valve is sufficiently small to pass through a standard $2\frac{3}{4}$ inch knife-edge flange, and is acoustically, electrically, and magnetically quiet.

The electromagnetic valve includes a valve mechanism which consists of three major parts: an actuator assembly, an end plate with a central aperture, and a mounting ring. The actuator assembly consists of two solenoid windings, each wound in a low-loss ferrite core. The cores are axially aligned and U-shaped in cross-section, with their open sides facing each other and being spaced apart a fixed distance by a non-magnetic ring. Inside this ring, and within the gap formed between the core faces, is a thin disc of magnetic material, the disc being axially movable in the gap.

The two cores are annular in shape with their central openings being axially aligned. A small diameter aluminum tube extends from the center of the disc through a bearing in the center of the forward core and terminates in a tip which secures a valve head adapted to engage and close the central aperture in the end plate. A mounting ring secures the cores to the end plate, with the ring, end plate, and the forward solenoid core defining a gas reservoir surrounding the valve head and the aluminum tube. The center opening of the cores is sealed from the gas chamber by means of a metal bellows which surrounds the valve tube and is secured to the valve tip at one end to the forward core at the other.

In operation, the solenoid coils are alternately energized to move the disc, and thus the tube, forward and rearward to close and to open the aperture in the end plate. When the aperture is open, gas under pressure is ejected from the gas reservoir through the aperture. By providing a lightweight valve actuating assembly, the valve reacts rapidly to the control pulses applied to the solenoid coils, whereby very short pulses on the order of 70 microseconds can be produced at frequencies of about 35 Hz.

In the preferred embodiment, the end plate incorporates an expansion aperture so that a fast rise time in the density of the gas pulse is obtained. This arrangement produces an essentially zero time delay between the time the gas passes through the valve and the time it is cooled by expansion. The bellows seal which separates the valve actuating mechanism from the sample gas supplied to the reservoir allows the beam valve to operate with corrosive samples, without damage to the valve mechanism. Furthermore, the bellows permits equalization of the pressure within the bellows with that of the sample gas, enabling the pressure of the sample to be varied without affecting valve characteristics.

BRIEF DESCRIPTION OF THE DRAWINGS

The foregoing and additional objects, features and advantages of the present invention will become apparent from a consideration of the following detailed description thereof, taken in conjunction with the accompanying drawings, in which.

DESCRIPTION OF A PREFERRED EMBODIMENT

Figure 1:
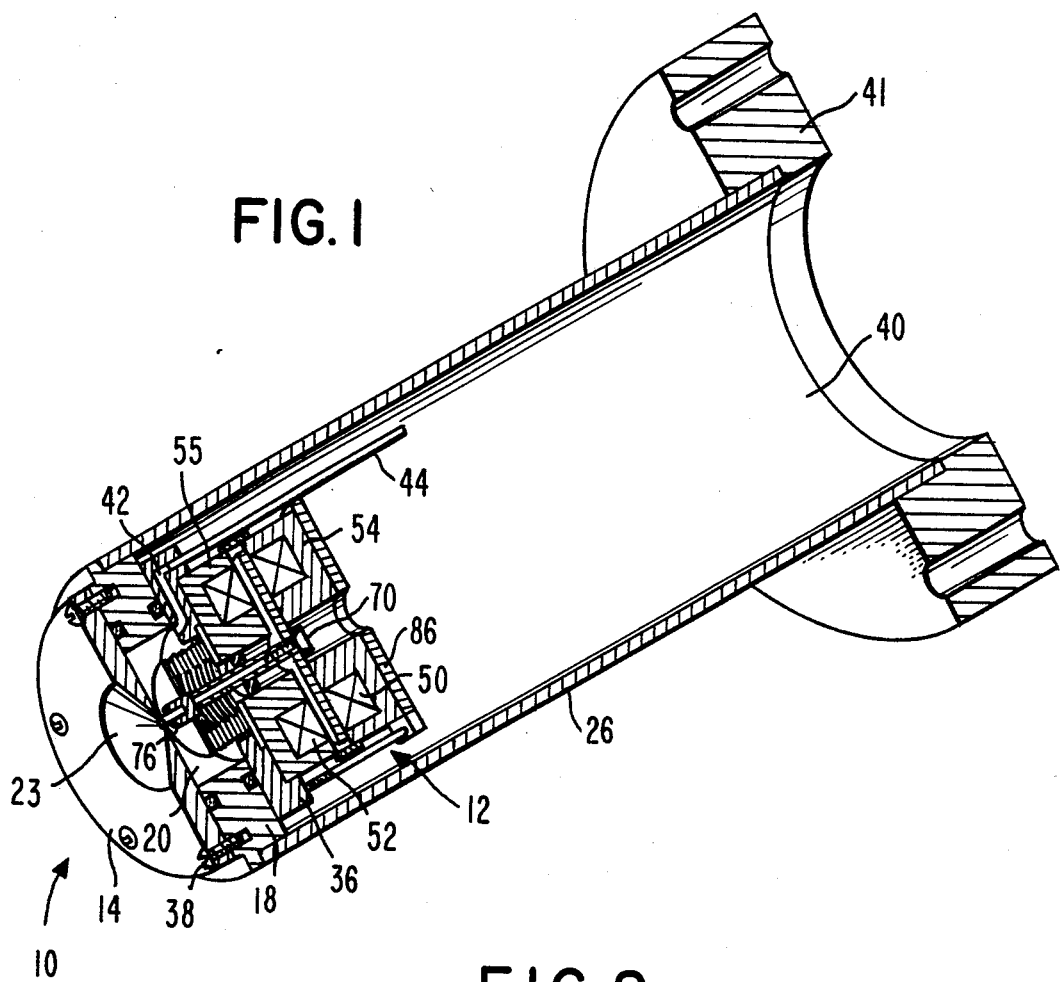
FIG. 1 is a perspective cross-sectional view of an electromagnetic molecular beam valve constructed in accordance with the present invention.
Figure 2:
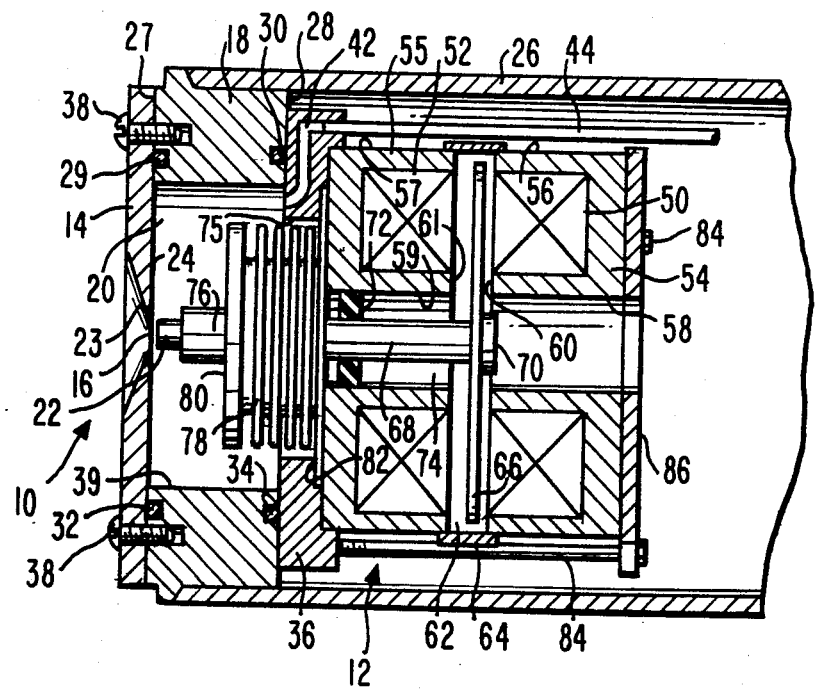
FIG. 2 is an enlarged partial sectional view of the valve actuator structure shown in FIG. 1.

Referring now in greater detail to the drawings, there is shown in FIGS. 1 and 2 an electromagnetic valve 10 constructed in accordance with a preferred form of the invention, and comprising an actuator assembly generally indicated at 12, an end plate 14 having a central aperture 16, and a mounting ring 18 by which the actuator assembly 12 is secured to the end plate 14 to define within the annular mounting ring a gas reservoir 20. The valve actuator mechanism 12 controls the motion of a valve head 22 toward and away from aperture 16 to regulate the flow of gas from reservoir 20 outwardly through aperture 16 (toward the left as viewed in FIG. 2) to provide the required molecular beam.

The end plate 14 consists of a disc, preferably stainless steel, with a conical hole 23 bored in its center from the exterior side. The conical hole terminates at the aperture 16 which is formed in the back surface 24 of the end plate. This aperture preferably is electron-beam welded to a diameter of 800 $\mu$m to provide a sharp edge for the aperture as well as a precise diameter. The edge of aperture 16 serves as a valve seat for valve head 22, while the conical surface 23 forms an expansion nozzle for the gas flowing out of the reservoir 20. This arrangement avoids the dead volume that would produce a longer rise time for the gas pulse if the expansion nozzle were to be spaced further away from the valve seat.

The annular mounting ring 18 preferably is formed of stainless steel, and is welded at its outer surface to the distal end of an extension tube 26 which forms a housing for the valve. The extension tube may, for example, be of stainless steel with an outer diameter of 1.25 inches and a length suitable for the spectroscopic equipment with which the valve is to be used. The front and back faces 27 and 28 of the mounting ring 18 have corresponding annular grooves 29 and 30 which carry O-ring seals 32 and 34, respectively. The actuator assembly 12 is secured to the back face 28 of ring 18 by suitable bolts or other fasteners (not shown) passing through an actuator assembly flange 36, which may be of stainless steel, whereby the O-ring 34 provides a gas-tight seal therebetween, so that the actuator assembly 12 forms a part of the back wall of gas reservoir 20. The end plate 14 is secured to the front face 27 of mounting ring 18 by means of bolts 38 or other suitable fasteners, with O-ring 32 forming a gas-tight seal therebetween. The end plate 14 thus forms the front wall of the gas reservoir, while the side wall is defined by the inner surface 39 of the annular mounting ring 18.

In one form of the invention, the extension tube 26 is secured at its near end 40 to suitable vacuum apparatus by, for example, welding it to a mounting flange 41 of conventional construction, which enables the extension tube and its valve assembly to be mounted to extend into a vacuum chamber for spectral analysis of the molecular beam.

Access to the gas reservoir 20 is obtained through a passageway 42 passing through the mounting flange 36 from the rear side to the forward surface thereof, passageway 42 serving as a sample gas inlet. Gas under pressure may be supplied to the inlet 42 by means of a supply tube 44 which preferably is of stainless steel and which, for example, may have a one-sixteenth inch outer diameter. Tube 44 may be brazed to the inlet 42 and leads through the extension tube 26 to a suitable sample gas source (not shown).

The actuator assembly 12 consists of two separate windings, an opening coil 50 and a closing coil 52 each wound within corresponding annular low-loss ferrite cores 54 and 55. The cores have outer annular walls 56 and 57, respectively, and inner annular walls 58 and 59, respectively, with the body of each core being generally U-shaped in cross-section. The cores have open faces 60 and 61, respectively, and are mounted in axial alignment so that the open faces of the cores oppose each other. These axially aligned, opposed cores are spaced apart to define a gap 62, and are secured at a fixed distance by a non-magnetic annular ring 64 formed, for example, of aluminum. The ring 64 is secured to the outer annular surfaces 56 and 57 of the cores and closes off the gap 62.

Mounted inside the ring 64, and located within the gap 62, is a thin valve driver disc 66 of magnetic material. The disc is of substantially less thickness than the gap 62 and is smaller in diameter than ring 64 so that it is freely movable within the gap, between the core faces 61 and 62. Disc 66 is mounted on a thin, lightweight, small diameter valve actuator tube 68 which preferably is of a non-magnetic material such as aluminum. The tube acts as a valve shaft, and may be secured to the disc 66 by means of a suitable threaded fastener 70 passing through the disc and into the center of tube 68, or by other suitable means. Tube 68 is coaxial with the cores 54 and 55, and may be secured in alignment therewith by a suitable bearing 72 mounted within the central aperture 74 of core 55, the bearing permitting free motion of the tube 68 in an axial direction.

The actuator assembly 12 is secured on the rear surface 28 of mounting ring 18 by means of annular flange 36, as described above, so that the common axis of the cores 54 and 55 and of actuator tube 68 is aligned with the center of aperture 16, with the bearing 72 holding the tube in proper alignment.

The forward end of actuator tube 68 extends through the central aperture 75 of flange 36, and into the gas reservoir 20, where it terminates in a tip 76 which is shown in cross-section in FIG. 1 and in plan view in FIG. 2. Tip 76, which preferably is of stainless steel, holds the valve head 22 adjacent the aperture 16. The valve head may be a short rod of material such as Viton that acts as the valve seal.

A small metal bellows 78, shown in cross-section in FIG. 1 and in plane view in FIG. 2, is connected between the tip 76 and the mounting flange 36, with the bellows surrounding the actuator tube 68 and extending through aperture 75 in flange 36. The front wall 80 of the bellows is welded to the tip 76, while the rear wall 82 is welded to the interior wall of flange 36, thereby closing off the central aperture 75 of the mounting flange 36 and completing the closure of the back wall of the gas reservoir to isolate the valve actuator assembly from the sample gas. This allows the beam valve to operate with corrosive gas samples without damaging the actuator.

The solenoid cores 54 and 55 may be secured to flange 36 by any suitable means, such as bolts 84 passing through a rear annular support plate 86.

Sealing off the gas reservoir 20 from the actuator assembly 12 permits the inside of the housing 26, the cores 54 and 55 and the actuating tube 68, as well as the disc 66 to be operated at atmospheric pressure and out of contact with the sample gas. This also permits the interior of the extension tube 26 to be evacuated or to be pressurized, as desired, to equalize the pressure within the extension tube, and thus the pressure within the bellows 78, with the pressure of the sample gas in reservoir 20, so that the operational characteristics of the valve mechanism don't change with changes in the pressure of the sample gas.

Figure 3:
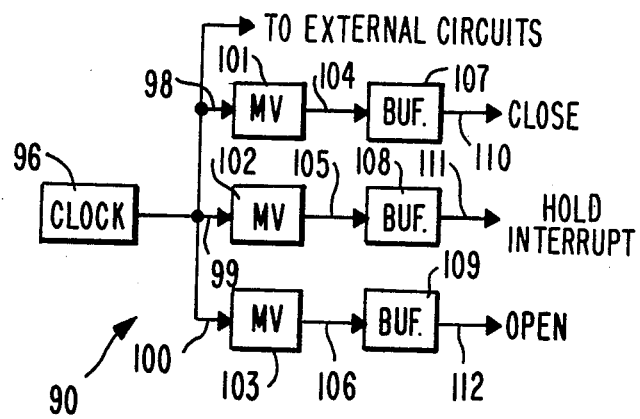
FIG. 3 is a block diagram of the timing circuitry used to control the operation of valve of FIGS. 1 and 2.
Figure 4:
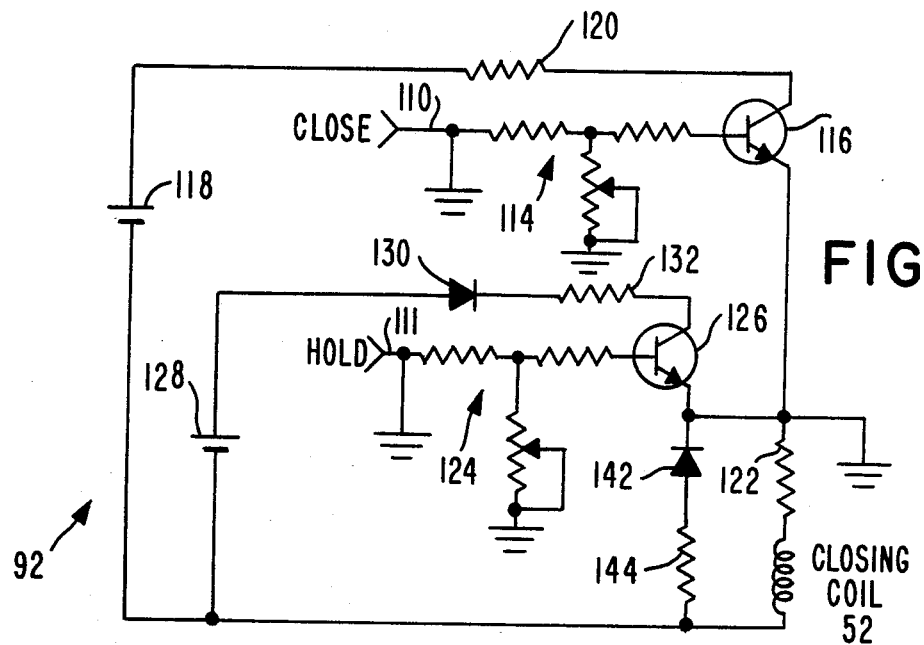
FIG. 4 illustrates the drive circuitry for amplifying the close and hold timing signals provided by the circuit of FIG. 3.
Figure 5:
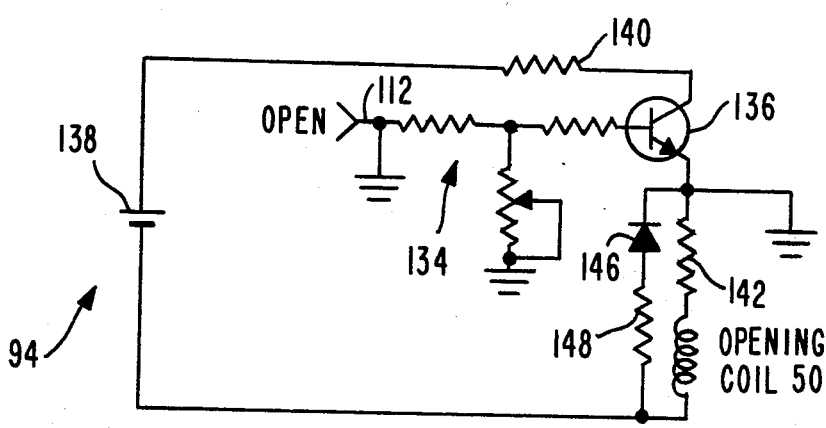
FIG. 5 is a schematic diagram of a drive circuit responsive to the open signal produced by the timing circuit of FIG. 3.

The solenoid coils 50 and 52 are driven by a timing circuit 90, illustrated in FIG. 3, and by driving circuits 92 and 94, illustrated in FIGS. 4 and 5, respectively, to which reference is now made. In the timing circuit of FIG. 3, a clock 96, which may be a 555 integrated microcircuit, provides a trigger signal for both the molecular beam and any external detection apparatus (not shown) that might be used in synchronization with the operation of the valve and thus with the beam produced by the valve. The clock output for operating the valve 10 may be provided on three parallel lines 98, 99 and 100, with the clock signal triggering respective multivibrators 101, 102 and 103. Each multivibrator produces an independently variable delay and each produces on its corresponding output lines 104, 105 and 106 pulses of selected width to produce the desired timing for the valve. The signals on lines 104 through 106 are supplied to corresponding unity gain line drive buffers 107 through 109 to produce corresponding output timing signals on lines 110 through 112. The multivibrator 103 produces on its output line 112 a signal which provides the timing for the opening of valve 10 while the output from multivibrator 101 produces an output signal on line 110 to provide the timing for the closing current for valve 10. The third circuit, which comprises multivibrator 102, provides a signal on line 111 which normally produces a steady holding current that keeps the valve 10 closed between pulses, and which times the interruption of that current when the valve is to be opened.

The driving circuits of FIG. 4 and 5 step up the timing pulses on lines 110 through 112 to a sufficiently high current to drive the coils 50 and 52 of the valve assembly. The drive circuit 92 is responsive to the "close" signal on line 110 and to the "hold interrupt" signal on line 111 to activate the closing coil 52. The close signal is applied through a variable resistance network 114 to the base of a high gain Darlington transistor 116 to turn the transistor on. The current then flows from a supply source 118, which may be a 65 volt power supply, through resistor 120, through the base-emitter circuit of transistor 116, through transistor 122 and closing coil 52 back to the source 118. Application of a close pulse on line 110 thus energizes the closing coil 52 and maintains it in its energized condition until the end of the pulse.

The signal on line 111 is applied through a variable resistance network 124 to the base of a second high gain Darlington transistor 126. A pulse on line 111 turns transistor 126 on, allowing current to flow from supply source 128, which may be a 5 volt power supply, through diode 130, resistor 132, the collector-emitter circuit of transistor 126, and through resistor 122 and closing coil 52 back to the power supply 128. The presence of a signal on line 111 holds the closing coil in its energized condition.

The opening coil 50 is controlled by the drive circuit 94 illustrated in FIG. 5. This circuit is similar to the circuits of FIG. 4, and includes a variable resistance network 134 connected between line 112 and the base of a high gain Darlington transistor 136. The appearance of a pulse on line 112 causes transistor 136 to become conductive, allowing current to flow from a supply source 138, which may be a 65 volt power supply, through a resistor 140, through the collector-emitter circuit of transistor 136, and through a resistor 142 and the coil 50 back to the power supply.

When a timing signal appears on any one of the three timing circuit outputs 110, 111 or 112, the corresponding high gain transistor 116, 126, or 136 becomes conductive and current then flows through the actuator coil that is in series with the conducting transistor. When the corresponding timing circuit switches low, its transistor turns off. To prevent damaging voltage spikes, which may be produced by the inductance of the actuator coils, a bypass diode 142 and series resistor 144 are connected across coil 52, and a similar bypass diode 146 and series resistor 148 are connected across the coil 50, these by-pass networks allowing the current in the closing coils to decay slowly.

In the preferred form of the invention, the resistance of each of the two actuator coils is less than 0.1 ohm. A resistor in series with each Darlington transistor limits the maximum current through the actuator coils to 2 amps for the opening and closing pulses, and to 1 amp for the high duty-cycle holding current. Thus, the system of the present invention operates at a substantially lower power level than prior devices.

In operation, the sample gas is fed under pressure by way of tube 44 to reservoir 20. Initially, valve 10 is closed, with the valve head 22 being held against the valve seat 16 by energizing the closing coil 52 with a holding current obtained from the timing circuit 90. Energization of coil 52 causes the thin magnetic disc 66 to be pulled forward (toward the left in FIG. 2), toward engagement with the face of core 55, thereby moving the valve head into engagement with the end plate 14 and sealing the aperture 16. This is the normal, closed condition of the valve, in which a steady holding current is supplied to the closing coil 52, as indicated by trace 150 in FIG. 6C. The holding current is a steady positive value of relatively low amplitude.

Figure 6:
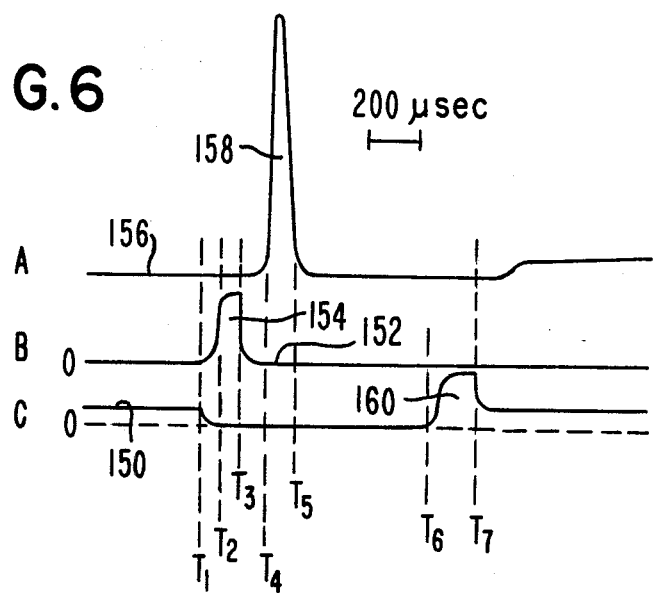
FIGS. 6A, 6B and 6C are oscilliscope traces of the electrical timing signals from the circuits of FIGS. 3-5 and the gas pulse produced by the valve of FIGS. 1 and 2 in response to the electrical signals.

At the beginning of an operational cycle, during which a burst of sample gas is to be released by the valve 10, the holding current is turned off, as indicated in FIG. 6C at time $T_1$, by the timing circuit 90, and the current in the close coil decays to zero, as shown. Also at time $T_1$, as indicated by trace 152 in FIG. 6B, the timing circuit 90 provides an "open" pulse 154 on line 112 to turn transistor 136 on, and when this occurs, the current in opening coil 50 builds up rapidly, reaching a maximum value at about time $T_2$, with the magnetic field building correspondingly in the ferrite core 54. The current flow in the closing and opening coils 52 and 50 is in such a direction that the magnetic fields produced by their respective ferrite cores have the same radial-field direction in the disc 66; the only change in the magnetic field which occurs when the current in one coil is turned off and the current in the other is turned on is that the field lines normal to the disc at its center and at its perimeter simply shift from one core to the other, causing the disc to shift back and forth in the gap between the cores. This minimizes the eddy current losses in the disc.

The short, sharp "open" pulse 154 and the coincident removal of the holding signal 150 from the closing coil reverses the magnetic field in the gap 62, causing the magnetic disc 66 to move sharply toward the right (as viewed in FIG. 2) across the gap, thereby pulling the valve head 22 away from aperture 16 and allowing gas from reservoir 20 to expand through the aperture and the coneshaped opening 22 to form a stream of gas. At the end of the opening pulse 154, at time $T_3$, transistor 136 is turned off, and the current flow to coil 50 terminates. The collapsing magnetic field produced by the declining current in the opening coil 50 causes the disc 66 to start to move away from the opening coil 50 to close the valve. The amplitude of the open pulse 154 as well as the width of that pulse are adjustable to provide the desired minimum valve opening time as well as the desired duration of the sample gas burst.

FIG. 6A illustrates an oscilliscope trace 156 of the gas pulse produced by valve 10 as measured by a spectrometer spaced from the valve and through which the gas passes. This pulse is shown as occurring at a time slightly lagging the opening pulse 154, although it should be noted that in reality the location of the aperture 16 at the rear surface of end plate 14 and its proximity to the expansion aperture 22 produces a very rapid rise time in the gas pulse upon operation of the valve and provides essentially zero time delay to the expansion aperture.

For spectroscopic purposes, and to minimize the pumping load imposed on a vacuum chamber, the gas pulse should be as intense and as short as possible. The pulse 158 obtainable with the present system has a width of approximately 70 microseconds, even with the pulse width having been spread by the shutter function of the valve, the 10 microsecond response time of the amplifier used in the measuring equipment, and the time-of-flight distribution in the pulse itself due to the spread in molecular speeds. Lengthening of pulse 154 to hold the valve open longer increases both the intensity and the time width of the gas pulse.

Although the collapsing of the magnetic field in the opening coil 50 tends to close the valve 10, nevertheless the timing circuit 90 produces at time $T_6$ a closing pulse 160 (FIG. 6C) which activates the closing coil 52 to firmly close the valve. At the end of closing pulse 160, at time $T_7$, the holding current is again applied to the closing coil to secure the valve in the closed position.

In the preferred form of the invention, the disc 66, and thus the valve head 22, have a stroke equal to 0.4 millimeters, with the mass of the moving parts being 2.7 grams. This light weight and short stroke allows very rapid oscillation of the valve head, while still permitting it to open fully to produce pulses of high intensity. Frequencies of 35 Hz are easily obtainable with this device, and produce pulse widths in the neighborhood of 70 microseconds.

Figure 7:
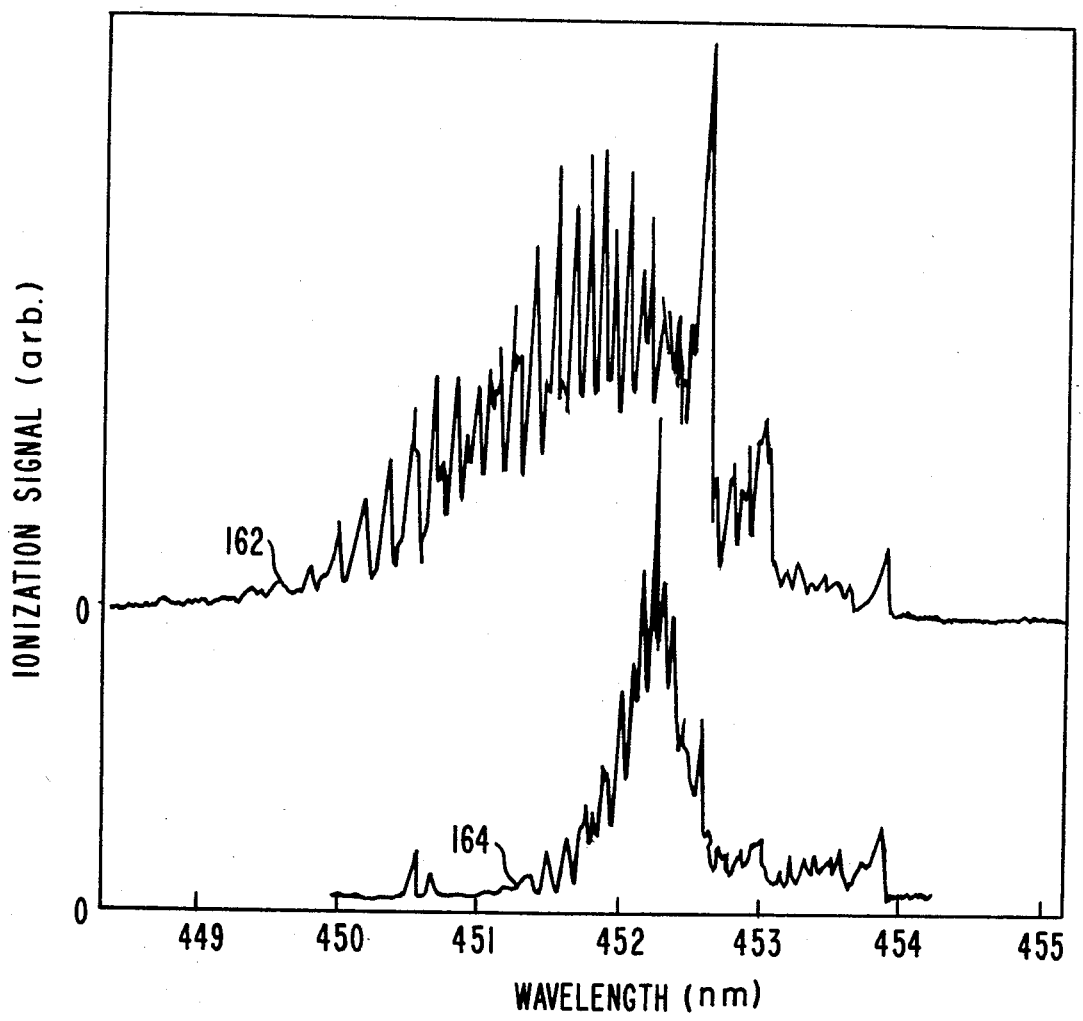
FIG. 7 is a comparison of the ionization spectrum of prior art devices with the device of the invention.

FIG. 7 shows at traces 162 and 164 a comparison of the trace produced by a tunable dye laser-induced multiphoton ionization spectrum of nitrous oxide (NO) in a room temperature flow at $5 \times 10^{-5}$ Torr (trace 162) versus the multiphoton ionization spectrum of NO in the molecular beam produced by the valve of the present invention (trace 164). In the ionization trace 164, the NO is seeded in helium at a ratio of 1:4, with the molecular beam being produced from a 1-atmosphere stagnation pressure in the gas reservoir. It is evident from FIG. 7 that significant rotational cooling occurs in the supersonic expansion from the valve aperture 16, resulting in a decreased absorption from rotational hot bands. A simulation of this spectrum using known ground and excited state rotational constants for NO and an equilibrium Boltzmann distribution of rotational population in the ground state reveal that the simulation, for a specified temperature of 25k, best matches the profile of trace 164 obtained with the molecular beam.

The valve of the present invention has operated for short periods of time at 35 Hz and for long periods at 10 Hz without failure. The current pulses required to open and to close the valve are small, and as a result the beam is durable and quiet. Although the ion detection electronics used in conjunction with this device embody a gain of $10^{14}$, no electrical interference from the valve has been detected. Because the valve is electronically driven, the characteristics of the valve, and thus of the gas pulse are electronically variable, providing a flexibility that is not available with prior spring-loaded valves or with valves requiring high power levels. The electronic circuitry permits operation at cyclical rates which can be adjusted to avoid mechanical resonance and to eliminate mechanical bounce.

Although the present invention has been described in terms of a preferred embodiment, it will be apparent to those of ordinary skill in the art that various modifications can be made without departing from the true spirit and scope of the invention as set forth in the following claims:

What is claimed:

1. An electromagnetically operated valve for generating a high pressure molecular beam gas pulse having an extremely short, accurate, controllable pulse duration on the order of 70 microseconds, comprising:

an aperture plate including a valve seat surrounding an expansion aperture in said plate, said expansion aperture comprising a conical hole terminating at a sharp edge on one surface of said aperture plate, said sharp edge serving as said valve seat;

a valve head moveable with respect to said aperture plate in a first direction to engage said valve seat to close said expansion aperture and in a second direction to disengage said valve seat to open said expansion aperture;

a sample gas reservoir surrounding said valve head and adapted to receive a sample gas under high pressure for controlled dispersion through said expansion aperture upon opening of said expansion aperture;

a valve actuator assembly to controllably move said valve head in said second direction to open said expansion aperture to permit a pulse of gas to flow therethrough from said reservoir, said expansion aperture allowing said sample gas to be dispersed substantially without delay or pressure drop, thereby to produce a gas pulse having an extremely short rise time, and to controllably move said valve head in said first direction to close said expansion aperture, said assembly comprising a light weight valve shaft connected to said valve head, first and second coils mounted in spaced-apart opposition to define a gap therebetween, and light weight driver means connected to said valve shaft and mounted in said gap to move therethrough in response to energization and deenergization of said coils; first and second drive circuit means producing first and second drive pulses for alternately and selectively energizing and deenergizing said coils to move said driver means through said gap, thereby to move said valve shaft and said valve head alternately in said first and second directions to close and open said expansion aperture, energization of said second coil producing a magnetic field to move said driver means to open said expansion aperture, deenergization of said second coil collapsing said magnetic field to move said driver means in a direction to close said expansion aperture, and subsequent energization of said first coil holding said expansion aperture closed; and selectively variable timer circuit means for regulating said first and second drive circuit means to produce drive pulses to regulate the time and duration of opening said expansion aperture and to control the intensity and duration of the pulse of gas emitted through said expansion aperture, said drive circuit means for said second coil producing drive pulses of sufficient amplitude and of sufficiently short duration to fully open said expansion aperture to allow dispersion of a short, high pressure pulse of sample gas from said reservoir, and thereafter to close said expansion aperture to produce a molecular beam pulse of approximately 70 microseconds' duration.

2. The valve of claim 1, further including bellows means surrounding said valve shaft and isolating said actuator assembly from said gas reservoir while providing a pressure at said valve actuator substantially equal to the pressure of the sample gas.

3. The valve of claim 1, further including first and second annular cores each having a central aperture, and each being generally U-shaped in cross-section with an open face, said first and second coils being wound on said first and second cores, respectively.

4. The valve of claim 3, wherein said annular cores are mounted coaxially, with their respective open faces being in spaced opposition to define said gap.

5. The valve of claim 4, further including a non-magnetic annular ring surrounding said gap and securing said cores in a fixed relationship.

6. The valve of claim 1, further including a housing, said aperture plate defining one end of said housing;
    mounting means for securing said valve actuator assembly within said housing with said sample gas reservoir being located between said aperture plate and said valve actuator; and
    means for isolating said valve actuator assembly from a sample gas in said gas reservoir while providing a pressure at said valve actuator substantially equal to the pressure of the sample gas.

7. The valve of claim 6, wherein said mounting means for securing said valve actuator assembly comprises an annular mounting ring secured to said aperture plate, said mounting ring defining a side wall of said gas reservoir, said aperture plate defining a forward wall of said gas reservoir, and said valve actuator assembly defining a rear portion of said gas reservoir.

8. The valve of claim 7, wherein said isolating means comprises a bellows secured to said valve actuator assembly.

9. The valve of claim 8, wherein said bellows is connected at one end to said valve shaft and at the other end to said first annular core and wherein said first annular core is secured to said mounting ring, whereby said bellows isolates said valve shaft, said driver means, and said gap from a sample gas in said gas reservoir.

10. The valve of claim 9, further including means for supplying a sample gas under pressure to said gas reservoir, and means for maintaining the pressure within said bellows substantially equal to the pressure of said sample gas.

11. The valve of claim 1, wherein said driver means comprises a thin disc within said gap, said disc being of magnetic material and responsive to energization of one of the other of said coils to move across said gap.

12. The valve of claim 11, wherein said valve shaft comprises a thin, lightweight, small diameter tube, said tube being connected at a first end to said disc.

13. The valve of claim 12, further including tip means at a second end of said tube, said tip means carrying said valve head.

14. The valve of claim 1, wherein said timer circuit means includes means to produce an open pulse of selected duration, said second drive circuit including means responsive to a start of said open pulse to energize said second coil to open said valve and responsive to a termination of said open pulse to deenergize said second coil, such deenergization resulting in closure of said valve.

15. The valve of claim 14, wherein said timer circuit further includes means to produce a close pulse of selected duration, said first drive circuit including means responsive to said close pulse to energize said first coil to close said valve.

16. The valve of claim 14, wherein said timer circuit further includes means to produce a hold pulse of selected duration, said first drive circuit including further means responsive to said hold pulse to maintain said first coil at a low level of energization to maintain said valve in a closed position.

* * * * *

UNITED STATES PATENT AND TRADEMARK OFFICE
CERTIFICATE OF CORRECTION

PATENT NO. : 4,583,710

DATED : April 22, 1986

INVENTOR(S) : Thomas E. Adams, et al.

It is certified that error appears in the above-identified patent and that said Letters Patent is hereby corrected as shown below:

Claim 11, line 4, change "of" (first occurence) to --or--.

Signed and Sealed this

Fifteenth Day of July 1986

[SEAL]

Attest:

Attesting Officer

DONALD J. QUIGG

Commissioner of Patents and Trademarks